(12) United States Patent
Yu et al.

(10) Patent No.: US 11,681,474 B2
(45) Date of Patent: Jun. 20, 2023

(54) MANAGEMENT OF PEAK CURRENT OF MEMORY DIES IN A MEMORY SUB-SYSTEM

(71) Applicant: Micron Technology, Inc., Boise, ID (US)

(72) Inventors: Liang Yu, Boise, ID (US); John Paul Aglubat, Boise, ID (US); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/562,590

(22) Filed: Dec. 27, 2021

(65) Prior Publication Data

US 2022/0121399 A1 Apr. 21, 2022

Related U.S. Application Data

(63) Continuation of application No. 16/871,366, filed on May 11, 2020, now Pat. No. 11,216,219.

(51) Int. Cl.
*G06F 3/00* (2006.01)
*G06F 3/06* (2006.01)
*G11C 7/10* (2006.01)
*G06F 1/14* (2006.01)

(52) U.S. Cl.
CPC ............ *G06F 3/0659* (2013.01); *G06F 1/14* (2013.01); *G06F 3/0604* (2013.01); *G06F 3/0673* (2013.01); *G11C 7/1009* (2013.01)

(58) Field of Classification Search
CPC .......... G06F 30/398; G06F 9/455; G06F 1/14; G06F 3/06; G06F 30/392; G06F 40/284; G06F 11/00; G06F 16/43; G06F 16/81; G06F 16/93; G06F 16/953; G06F 30/33; G06F 40/169; G06F 40/186; G06F 11/10; G06F 11/22; G06F 12/00; G06F 13/36; G06F 13/374; G06F 13/42; G06F 15/04; G06F 16/20; G06F 3/04842; G06F 30/00; G06F 30/327; G06F 30/367; G06F 30/394; G06F 17/10; G06F 3/00; G06F 3/0484; G06F 40/216; G06F 40/289; G06F 40/30; G06F 7/50; G06F 9/30; G11C 7/10; G11C 29/00; G11C 29/04; G11C 29/50; G11C 5/14; G11C 8/00; G11C 8/06
USPC .................. 711/154, 167, E12.001, E12.069
See application file for complete search history.

(56) References Cited

U.S. PATENT DOCUMENTS

| 7,417,645 | B2 | 8/2008 | Beda et al. | |
| 2014/0075113 | A1* | 3/2014 | Takizawa | ............... G06F 3/0644 |
| | | | | 711/114 |

* cited by examiner

*Primary Examiner* — Thong Q Le
(74) *Attorney, Agent, or Firm* — Lowenstein Sandler LLP

(57) ABSTRACT

A portion of a memory management operation associated with a first current level that satisfies a condition pertaining to a threshold current level and a second current level that satisfies the condition pertaining to the threshold current level is identified. Mask data associated with the portion of the memory management operation is identified. Based on the mask data, a current management action is performed during execution of a requested memory management operation received from a host system.

20 Claims, 5 Drawing Sheets

MANAGEMENT OF PEAK CURRENT OF MEMORY DIES IN A MEMORY SUB-SYSTEM

CROSS-REFERENCE TO RELATED APPLICATION

This application is a continuation of U.S. patent application Ser. No. 16/871,366, filed May 11, 2020, the entirety of which is hereby incorporated by reference herein.

TECHNICAL FIELD

Embodiments of the disclosure relate generally to memory sub-systems, and more specifically, relate to management of peak current events of multiple memory dies in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
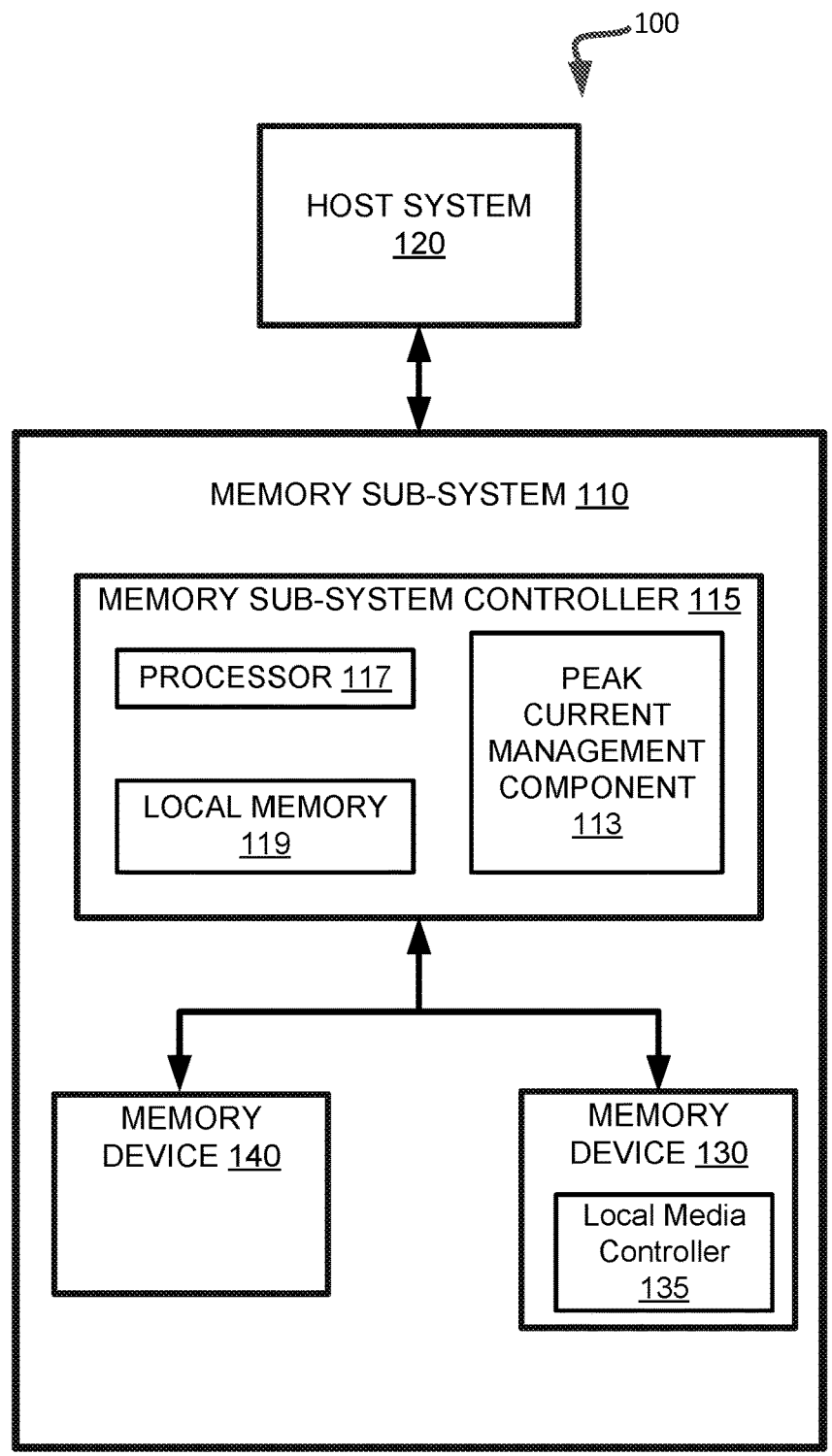
FIG. 1 illustrates an example computing system that includes a memory sub-system in accordance with some embodiments of the present disclosure.

Aspects of the present disclosure are directed to peak current management based on mask data associated with multiple peak current levels in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can perform multiple parallel operations (e.g., random reads, sequential reads, random writes, sequential writes, etc.) involving multiple memory devices having multiple memory dies. To perform a memory management operation (e.g., a read operation, program operation, erase operation, etc.), the memory sub-system can perform a respective set of sub-operations. For example, a read operation can be performed by measuring a threshold voltage of a memory cell to compare to a read voltage level to determine a stored data value. The parallel performance of multiple memory management operations involving multiple memory devices results in the consumption of peaks of higher current draw on a power supply. Execution of the memory management operations can result in multiple overlapping or parallel peak current events across multiple memory die.

Conventional power management techniques employ a mask to flag or identify only a highest current peak of each memory die executing memory management operations based on product validation data. This type of power management approach fails to effectively manage multiple high current peaks (e.g., current peaks above 150 mA) occurring in a single program/erase iteration across multiple memory dies. As such, masking further operations based only on a highest current for each memory die fails to account for other high current events on other memory dies performing parallel operations. Accordingly, conventional methods do not adequately reduce the probability of peak current collision or overlap wherein multiple high current peaks are experienced on multiple different memory dies simultaneously, resulting in a reduction in the stability and reliability of the data.

Aspects of the present disclosure address the above and other deficiencies by a memory sub-system that can issue a training command sequence to perform a set of memory management operations on multiple memory dies of the memory sub-system during a training phase. For example, the set of memory management operations can include one or more of a read operation (e.g., a set of instructions to execute a set of sub-operations to perform a read operation), a program operation (e.g., a set of instructions to execute a set of sub-operations to perform a program operation), an erase operation (e.g., a set of instructions to execute a set of sub-operations to perform an erase operation), a peak power emulation operation (e.g., a set of instructions to cause one or more peak power or peak current draw events), etc.

During this training phase, each memory die executes the array of training operations (e.g., read operations, program operations, erase operations, power testing operations) and determines corresponding peak current events. The peak current events can be determined by measuring a current draw level corresponding to one or more phases or portions of memory management operations. The measured current draw level is compared to a threshold current value to determine if a condition is satisfied. A peak current is identified if the measured current level exceeds the threshold peak current value (e.g., 90 mA)). A mask corresponding to a set of multiple consecutive peak currents identified during the training phase is identified. Advantageously, the mask (also referred to as a "super mask") corresponds to multiple peak currents (e.g., currents above the threshold peak current level) to identify, group, and manage consecutive peak currents as a single peak current. In the training phase, the system identifies the mask data corresponding to the respective memory management operations.

Following the training phase, the system manages the current level consumption by the memory dies during execution of memory management operations initiated by a host system using the mask data identifying the multiple super masks corresponding to the sets of multiple peak currents. To address overlapping peak currents in multiple memory dies during execution of a memory management operation requested by the host system (also referred to as a "target operation"), the system can identify the mask data associated with the target operation and apply the mask data across the multiple memory dies to block or pause overlapping peak currents.

Accordingly, the system enables the blocking of a set of multiple peak currents occurring during execution of a memory management operation (e.g., a program/erase loop) in a manner that cascades down a remainder of peaks in the program-erase loop. The mask data identified during the training phase can be shared by the memory dies to identify optimized configurations for peak current that is adaptable to different host systems having different power consumption conditions. Advantageously, masking multiple high current peaks during the execution of a memory management operation requested by a host system results in the efficient reduction of multiple dies peak collision probability by reducing approximately 30% of the high current peaks.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

The memory sub-system 110 includes a peak current management component 113 to manage a training phase during which a training command sequence is issued to multiple memory dies of the memory sub-system. In an embodiment, the training command sequence can be initiated or issued by the memory sub-system controller 115. In an embodiment, the peak current management component 113 monitors the performance of a target memory die during the execution of an array of training operations (e.g., one or more sets of memory management operations associated with the training command sequence). Each training operation can include one or more memory management operations including a set of sub-operations or functions related to the performance of one or more tasks or operations (e.g., read operations, program operations, erase operations, power testing simulation operations, etc.). In an embodiment, the peak current management component 113 sends the training command sequence to each memory die, in turn, until all of the memory dies have executed the set of memory management operations.

In an embodiment, the peak current management component 113 measures a current level resulting from the execution of portions or phases of the memory management operations (also referred to as a "memory management operation portion"). The memory management operation portion can include one or more sub-operations (e.g., a bitline precharge sub-operation, a wordline ramp up sub-operation, etc.) performed in connection with the execution of a memory management operation (e.g. a read operation). In an embodiment, each measured current level is compared to threshold peak current level (e.g., 90 mA) to determine if a condition is satisfied. In an embodiment, if the condition is satisfied (e.g., if the measured current level exceeds the threshold peak current level), the system identifies a peak current event. In an embodiment, the peak current management component 113 identifies and logs all current peaks having a value that is greater than the threshold peak current level. The memory management operation or portion corresponding to the peak current can be identified by the system as a "sensitive" operation due to the resulting peak current.

The peak current management component 113 generates mask data based on the identified peak currents. In an embodiment, a mask is generated for multiple consecutive peak currents (e.g., the measured current levels that exceed the threshold peak current level). This mask (also referred to as a "super mask") enables the system to manage multiple peak currents as one larger peak current. The mask data identifying the super masks can be stored in a log of the memory sub-system 110 (e.g., a log stored in a volatile memory (e.g., a RAM or SRAM storage location of the controller 115) or a non-volatile memory (e.g., a latch storage area of a memory device 130)). The peak current management component 113 shares the mask data among the multiple memory dies to allow peak current management across the multiple memory dies during execution of the memory management operations.

Following the training phase, the peak current management component 113 uses the mask data to manage the peak current consumption by the multiple memory dies during execution of the memory management operations requested by the host system 120. In an embodiment, in response to a request from the host system 120 to execute a target operation, the peak current management component 113 identifies the mask data corresponding to the target operation to enable the pausing or blocking of execution of portions of the target operation by one or more memory dies to avoid overlapping peak currents. The peak current management component 113 uses the mask data to improve peak current reduction efficiency improvement and has no conflicts with predictive PPM design of NAND 140s, and it could be an advanced feature to be on top of the predictive PPM design in future.

Figure 2:
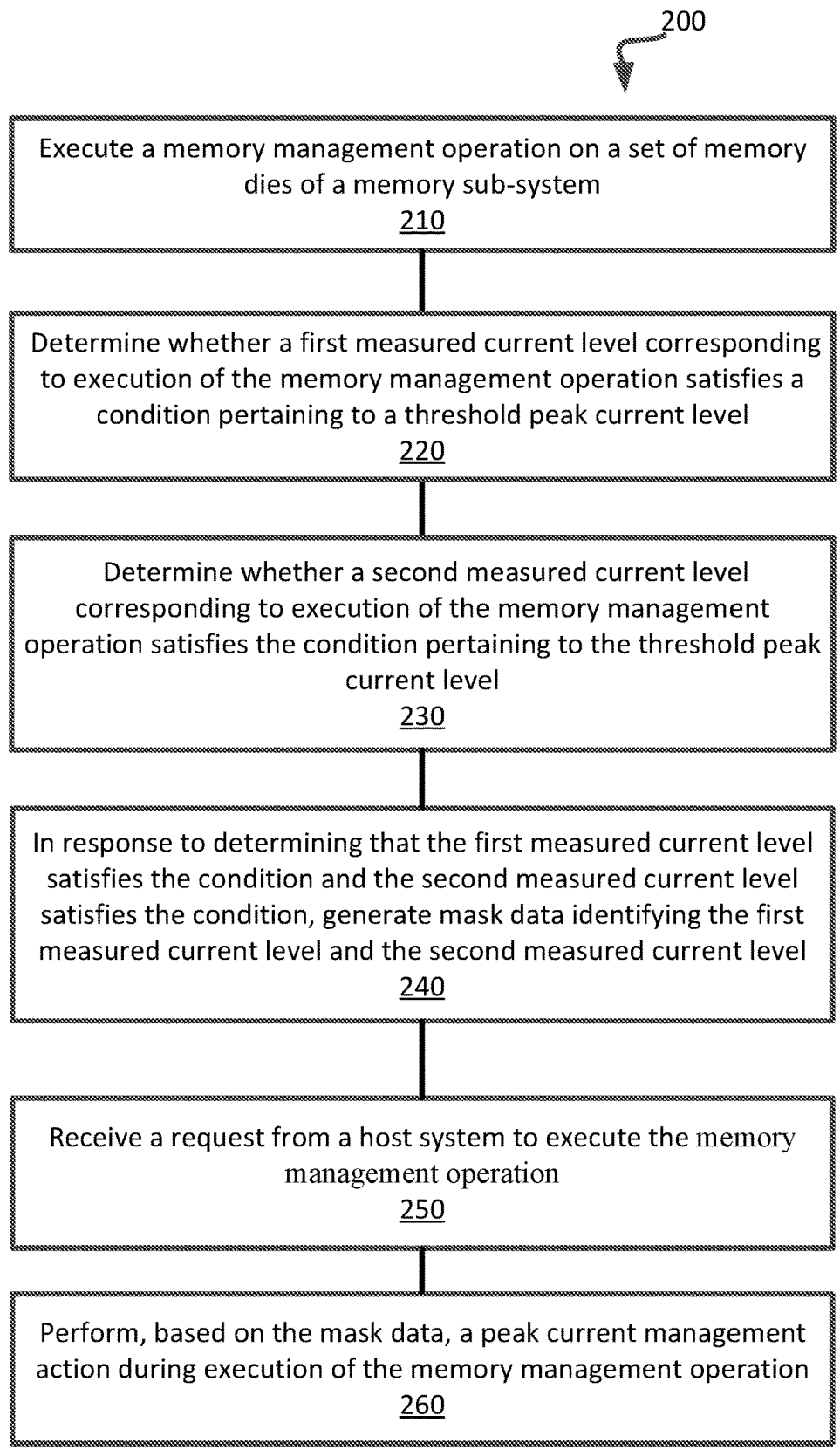
FIG. 2 is a flow diagram of an example method to perform a peak current management action in view mask data corresponding to memory dies of a memory sub-system in accordance with some embodiments.
Figure 3:
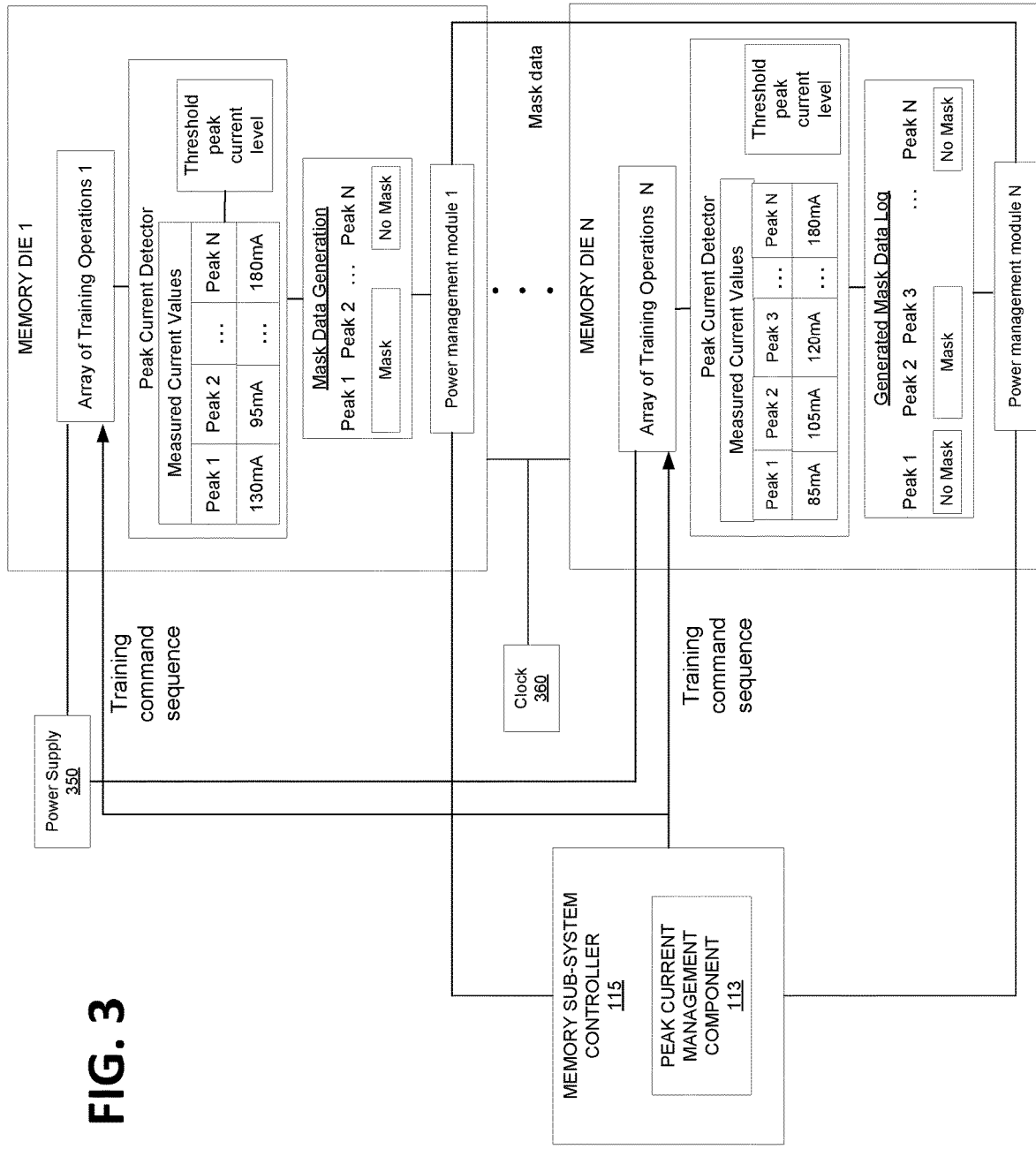
FIG. 3 illustrates an example system including a peak current management component configured to manage peak currents of memory dies in accordance with some embodiments in accordance with some embodiments.

FIG. 2 is a flow diagram of an example method 200 to generate mask data corresponding to multiple peak current events (e.g., measured current levels that exceed a threshold peak current level) corresponding to execution of an array of training operations (e.g., a set of memory management operations), in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the peak current management component 113 of FIG. 1. In addition, FIG. 3 illustrates an example memory sub-system 115 including a peak current management component 113 configured to perform the operations of method 200. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic executes a memory management operation on a set of memory dies of a memory sub-system. In an embodiment, the memory management operation is part of an array of training operations executed during a training stage relating to the set of memory dies. The memory management operation can include sets of instructions to perform an operation, such as a read operation, a program operation, an erase operation, a power emulation operation, etc. In an embodiment, each respective memory die (e.g., memory die 1 through memory die N of FIG. 3) executes the set of memory management operations which results in various current levels based on the drawing of current from a power supply 350 by the respective memory dies during execution of respective portions (e.g., one or more sub-operations) of the memory management operation of the array of training operations.

In an embodiment, the processing logic executes a command (also referred to as a "training command") for execution of the array of training operations by a set of memory dies of a memory package of the memory sub-system. In an embodiment, the command is initiated and executed during the training phase, during which the set of memory dies execute the array of training operations.

In an embodiment, a peak current management component 113 of a memory sub-system controller 115 can initiate the command sequence to enable execution of the array of training operations 1 through the array of training operations N by the multiple memory dies (e.g., memory die 1 through memory die N of FIG. 3). In an embodiment, the peak current management component 113 can issue each command sequence in turn to each of the memory dies (memory die 1 through N) until all of the memory dies have executed the set of memory management operations. In an embodiment, the peak current management component 113 can issue a single training command sequence that is sent to each of the memory dies for parallel execution of the set of memory management operations.

At operation 220, the processing logic determines whether a first measured current level corresponding to execution of the memory management operation satisfies a condition pertaining a threshold peak current level (e.g., meets or exceeds the threshold peak current level). In an embodiment, the first measured current level is detected in response to the execution of a respective portion of memory management operation by a first memory die of the set of memory dies. Accordingly, in operation 220, if the processing logic determines the first measured current level satisfies the condition by exceeding the threshold peak current level, the first measured current level is identified as a first peak current (or peak current event). Otherwise, if the processing logic determines the first measured current level does not satisfy the condition (i.e., the first measured current level is below the threshold peak current level), then the first measured current level is not identified as a peak current event.

In an embodiment, as shown in FIG. 3, the memory die may include a peak current detector including current detector components or circuits to measure a current level. The peak current detector can maintain a predefined or determined threshold peak current level (e.g., 90 mA, 100 mA, 110 mA, 120 mA, etc.). At operation 230, the processing logic determines whether a second measured current level corresponding to execution of the memory management operation satisfies a condition pertaining to the threshold peak current level (e.g., meets or exceeds the threshold peak current level). In an embodiment, the second measured current level is detected in response to the execution of a respective portion of memory management operation by the memory die of the set of memory dies. Accordingly, in operation 230, if the processing logic determines the second measured current level satisfies the condition by exceeding the threshold peak current level, the second measured current level is identified as a second peak current (or peak current event). Otherwise, if the processing logic determines the second measured current level does not satisfy the condition (i.e., the second measured current level is below the threshold peak current level), then the second measured current level is not identified as a peak current event. As shown in FIG. 3, the multiple peak currents (e.g., Peak 1 having a current level of 130 mA and Peak 2 having a current level of 95 mA) are identified, as described above, and stored in a log.

At operation 240, in response to determining that the first measured current level satisfies the condition and the second measured current level satisfies the condition, generate mask data identifying the first measured current level and the second measured current level, the processing logic generates mask data identifying the first measured current level and the second measured current level. In an embodiment, the mask data identifies at least a portion of the memory management operation (e.g., a portion of the array of training operations) that produced the first peak current (e.g., the first measured current level) and the second peak current (e.g., the second measured current level) as a masked operation. As shown in FIG. 3, the mask data identifies a mask (or super mask) corresponding to the masked operation (also referred to as a "sensitive operation") that produced Peak 1 and Peak 2. In an embodiment, mask data is generated to identify masked operations (e.g., operations producing multiple consecutive peak currents) for each of the memory dies of the multiple memory dies. According to embodiments, the mask data can be stored in a storage location of the memory die (e.g., a latch storage area of the memory die) or a volatile memory (e.g., RAM or SRAM memory) of the memory sub-system controller 115.

As shown in FIG. 3, the mask data for each memory die is shared or synchronized with the other memory dies by corresponding power management modules (e.g., power management module 1 through power management module N) of the peak current management component 113. In an embodiment, upon completion of the training phase (e.g., execution of the command sequence and corresponding array of training operations by each memory die of the memory sub-system), the generated mask data for each memory die is stored and accessible by a power management component (e.g., power management component 1 through power management component N). In an embodiment, the power management components are part of the peak current management component 113, and configured to access the mask data associated with each memory die. In an embodiment, the processing logic can be configured to not generate a mask for a last or final peak current (e.g., Peak N of FIG. 3) identified during the training phase.

At operation 250, the processing logic receives a request from a host system to execute the memory management operation. In an embodiment, after completion of the training phase, the peak current management component 113 operates to manage peak current levels of the memory sub-system during in-system execution of operation requests from a host system 120. In an embodiment, the host system 120 requests the execution of the memory management operation (also referred to as the "target memory management operation") identified during the training phase as a masked operation (e.g., an operation having multiple consecutive peak currents masked by a super mask). In an embodiment, in view of the request, the processing logic identifies the mask data associated with the target memory management operation. As an example shown in FIG. 3, the mask data identifies the super mask corresponding to Peak 1 and Peak 2 identified during the execution of the array of training operations by memory die 1. In an embodiment, the clock 360 maintains a counter used to synchronize execution by the memory dies. Each of the memory dies can be associated with a clock counter range for controlling when the memory dies operate, based on the current clock counter value.

At operation 260, the processing logic performs, based on the mask data, a peak current management action during execution of the memory management operation. In an embodiment, the peak current management action can include pausing or delaying execution by the other memory dies in the set of memory dies during execution of the masked operation by a first memory die. In an embodiment, during execution of the masked operation and production of the multiple consecutive peak currents by a first memory die, execution by the remaining memory dies is paused or delayed as a result of the peak current management action.

Figure 4:
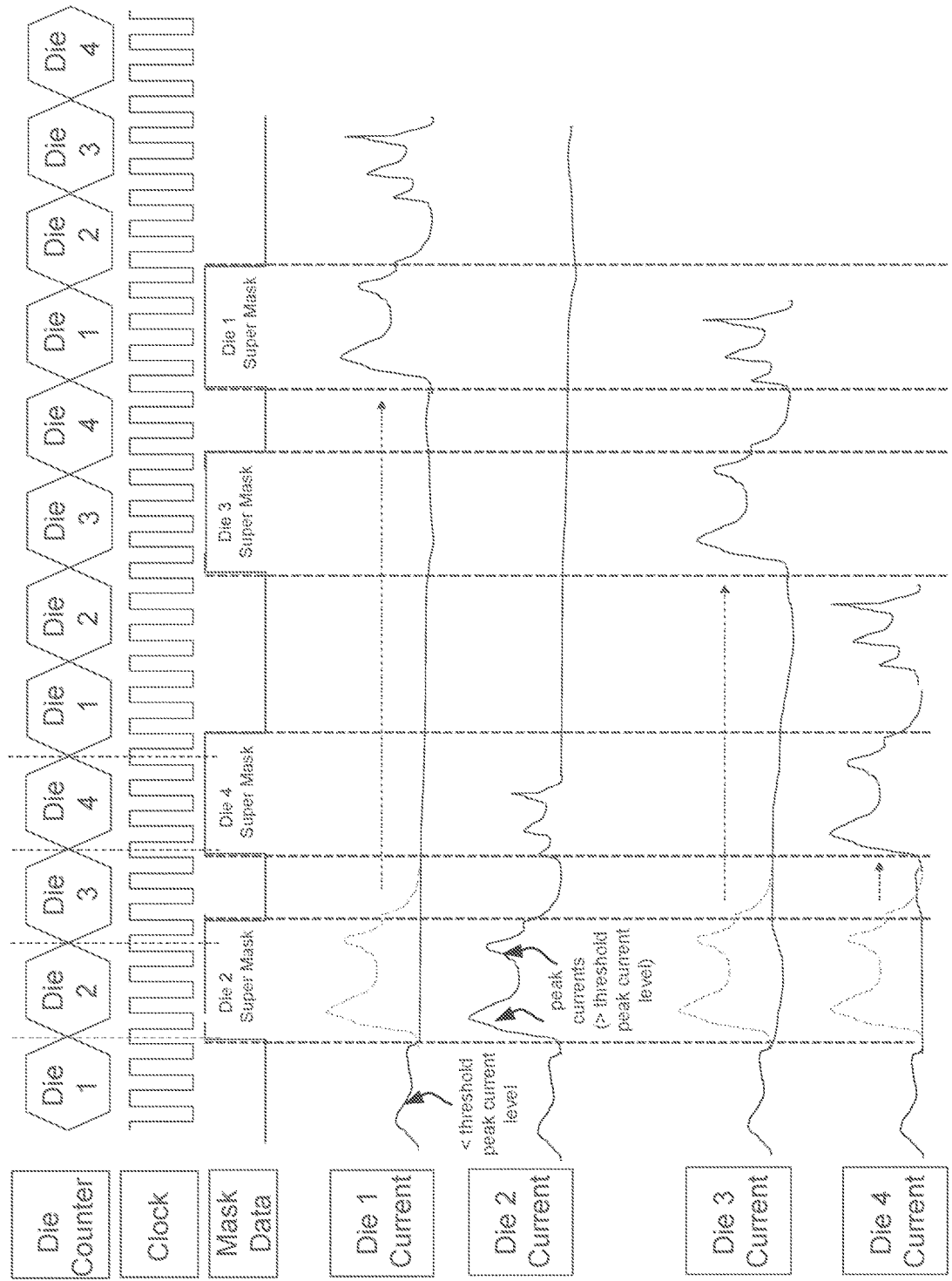
FIG. 4 illustrates peak current management actions corresponding to mask data of a set of memory dies in a memory sub-system in accordance with some embodiments.

FIG. 4 illustrates an example set of memory dies (i.e., memory die 1, memory die 2, memory die 3, and memory die 4) managed by the peak current management component 113 of the present disclosure. As shown, the set of memory dies are associated with a clock 360 (e.g., via a clock bus) that establishes a range of time during which each memory die executes. In an embodiment, all memory dies are assigned an address during the initialization of each memory die (e.g., through a set feature command). In an embodiment, each memory die is associated with a range of the clock counter during which the corresponding memory die executes an issued memory management operation.

In an example, as shown in FIG. 4, memory die 1 is assigned a clock counter range of 0-2, memory die 2 is assigned a clock counter range of 3-5, memory die 3 is assigned a clock counter range of 6-8, and memory die 4 is assigned a clock counter range of 9-11.

In the example shown in FIG. 4, when the set of memory dies (e.g., memory die 1 through memory die 4) start to run memory management operations at a first time (e.g., clock counter equals 3), the mask data associated with memory die 2 is identified because the clock counter value (e.g., value of 3) matches the clock counter range (3-5) associated with memory die 2. As shown, when memory die 2 executes the portion of the memory management operation associated with the super mask (e.g., the Die 2 Super Mask), the processing logic identifies the corresponding mask data and assigns a super mask indicator (e.g., a flag or token managed by the peak current management component 113) to memory die 2. The super mask indicator is assigned to a memory die during execution of a masked operation (e.g., an operation having multiple peak currents masked by a super mask executes a peak current management action). Since the clock counter corresponds to the clock counter range of memory die 2, the other memory dies (memory die 1, memory die 3, and memory die 4) determine the super mask indicator is assigned to memory die 2. In response, the other memory dies delay or pause execution (e.g., yield to memory die 2) until the super mask indicator is released (e.g., no longer assigned to memory die 2).

In the example shown, following the release of the super mask indicator by memory die 2, the clock counter may have a value that passed a start value of the clock counter range of memory die 3. For example, the current clock counter may be at a value of 7 upon release of the super mask indicator by memory die 2, passing the starting value of the clock range of memory die 3 (e.g., clock range of 6-8). Accordingly, in this example, execution resumes with memory die 4, as shown in FIG. 4. The memory die 4 super mask is executed and, as such, the super mask indicator is assigned to memory die 4 and the remaining memory dies (e.g., memory die 1, memory die 2, and memory die 3) are paused awaiting release of the super mask indicator. In this example, memory die 3 and memory die 1 execute their respective masked operations in turn as shown FIG. 4.

Figure 5:
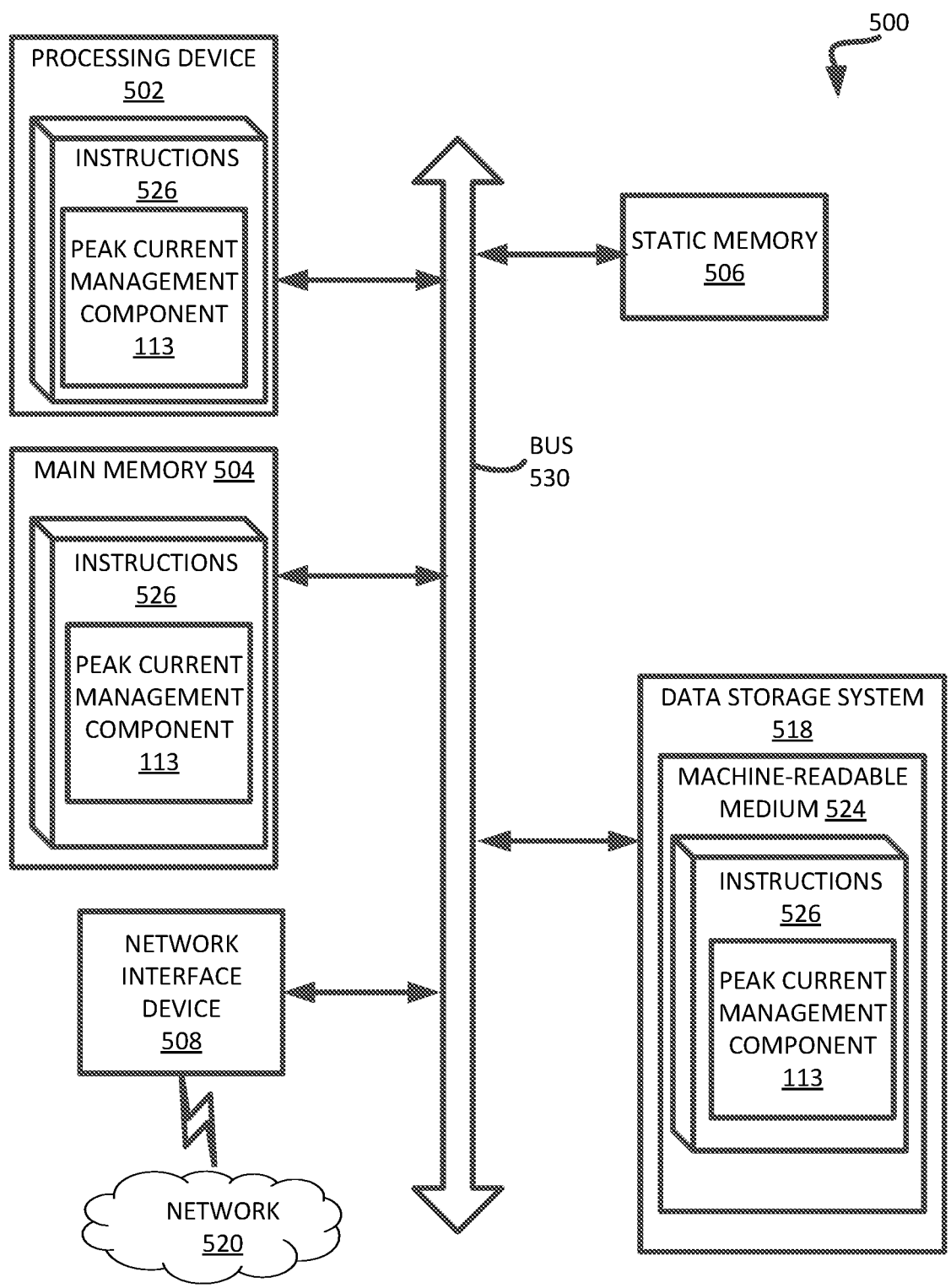
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a peak current management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a data protection component (e.g., the peak current management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
identifying a portion of a memory management operation associated with a first current level that satisfies a condition pertaining to a threshold current level and a second current level that satisfies the condition pertaining to the threshold current level;
identifying mask data associated with the portion of the memory management operation; and
performing, based on the mask data, a current management action during execution of a requested memory management operation received from a host system.

2. The method of claim 1, wherein the first current level exceeds the threshold current level occurring during execution of the portion of the memory management operation by a first memory die of a plurality of memory dies.

3. The method of claim 1, wherein the second current level exceeds the threshold current level occurring during execution of a second portion of the memory management operation by a second memory die of a plurality of memory dies.

4. The method of claim 1, wherein the mask data identifies a mask associated with at least one portion of the memory management operation producing the first current level and the second current level.

5. The method of claim 1, wherein the mask data is associated with the portion of the memory management operation based at least in part on a set of training data.

6. The method of claim 1, wherein the current management action comprises delaying execution of the requested memory management operation by one or more memory dies in response to identifying the mask data.

7. The method of claim 1, further comprising releasing a mask indicator assigned to a first memory die following execution of the portion of the memory management operation producing the first current level and the second current level.

8. The method of claim 1, further comprising:
identifying a second memory die assigned to a clock range corresponding to a value of a clock counter;
executing a further portion of the memory management operation to produce a third current level and a fourth current level, wherein the further portion is associated with additional mask data; and
assigning, based on the additional mask data, a mask indicator to the second memory die during execution of the further portion of the memory management operation producing the third current level and the fourth current level.

9. A non-transitory computer readable medium comprising instructions, which when executed by a processing device, cause the processing device to perform operations comprising:
setting, based on a set of training data, a mask flag corresponding to a first memory management operation associated with a current level that exceeds a threshold level;
executing the first memory management operation on a first memory die of a plurality of memory dies;
identifying the mask flag corresponding to the first memory management operation; and
pausing, in view of the mask flag, execution of a second memory management operation on a second memory die during execution of the first memory management operation.

10. The non-transitory computer readable medium of claim 9, wherein mask data associated with the mask flag is stored in a storage location of a controller of the plurality of memory dies.

11. The non-transitory computer readable medium of claim 9, the operations further comprising:
identifying the first memory die of the plurality of memory dies to execute the first memory management operation; and
assigning the mask flag to the first memory die.

12. The non-transitory computer readable medium of claim 11, the operations further comprising releasing, by the first memory die, the mask flag upon completion of the first memory management operation.

13. The non-transitory computer readable medium of claim 12, the operations further comprising:
identifying further mask data associated with a third memory management operation; and
pausing, in view of the further mask data, execution of a third memory management operation during execution of the third memory management operation.

14. A system comprising:
a plurality of memory dies; and
a processing device, operatively coupled with the plurality of memory dies, to perform operations comprising:
identifying a portion of a memory management operation associated with a first current level that satisfies a condition pertaining to a threshold current level and a second current level that satisfies the condition pertaining to the threshold current level;
identifying mask data associated with the portion of the memory management operation; and
performing, based on the mask data, a current management action during execution of a requested memory management operation received from a host system.

15. The system of claim 14, wherein the first current level exceeds the threshold current level occurring during execution of a first portion of the memory management operation by a first memory die of a plurality of memory dies.

16. The system of claim 14, wherein the second current level exceeds the threshold current level occurring during execution of a second portion of the memory management operation by a second memory die of a plurality of memory dies.

17. The system of claim 14, wherein the mask data identifies a mask associated with at least one portion of the memory management operation producing the first current level and the second current level.

18. The system of claim 14, wherein the mask data is associated with the portion of the memory management operation based at least in part on a set of training data.

19. The system of claim 14, wherein the current management action comprises delaying execution of the requested memory management operation by a subset of memory dies of the plurality of memory dies in response to identifying the mask data.

20. The system of claim 14, the operations further comprising releasing a mask indicator assigned to a first memory die following execution of the portion of the memory management operation producing the first current level and the second current level.

* * * * *